(12) United States Patent
Knee et al.

(10) Patent No.: US 11,552,610 B2
(45) Date of Patent: Jan. 10, 2023

(54) SUPERCONDUCTING OUTPUT AMPLIFIER INCLUDING COMPOUND DC-SQUIDS HAVING BOTH INPUTS DRIVEN BY AN INPUT SIGNAL HAVING THE SAME PHASE

(71) Applicant: Microsoft Technology Licensing, LLC, Redmond, WA (US)

(72) Inventors: Derek Leslie Knee, Fort Collins, CO (US); Jonathan D. Egan, Hanover, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/219,967

(22) Filed: Apr. 1, 2021

(65) Prior Publication Data
US 2022/0321072 A1    Oct. 6, 2022

(51) Int. Cl.
*H03F 19/00*    (2006.01)
*H01B 1/00*    (2006.01)

(52) U.S. Cl.
CPC .................... *H03F 19/00* (2013.01)

(58) Field of Classification Search
USPC ....................................................... 330/250
See application file for complete search history.

(56) References Cited

U.S. PATENT DOCUMENTS

| 10,243,582 | B1* | 3/2019 | Herr | H03M 7/14 |
| 10,651,808 | B2* | 5/2020 | Egan | H03F 1/02 |
| 11,211,117 | B2* | 12/2021 | Loving | H01L 39/025 |
| 2001/0025012 | A1 | 9/2001 | Tarutani et al. | |

OTHER PUBLICATIONS

Morooka, et al., "Array of Superconducting Quantum Interference Devices with Multitum Input Coil", In Japanese Journal of Applied Physics, vol. 43, No. 5A, May 1, 2004, pp. 2473-2478.
"International Search Report and Written Opinion Issued in PCT Application No. PCT/US22/017731", dated Jun. 17, 2022, 11 Pages.

* cited by examiner

*Primary Examiner* — Hieu P Nguyen
(74) *Attorney, Agent, or Firm* — Ranjeev Singh; Singh Law, PLLC

(57) ABSTRACT

Superconducting output amplifiers (OAs) including compound direct current-superconducting quantum interference devices (DC-SQUIDs) having both inputs driven by an input signal having the same phase and related methods are described. An example superconducting OA includes: (1) a first compound DC-SQUID having a first DC-SQUID and a second DC-SQUID, and (2) a second compound DC-SQUID having a third DC-SQUID and a fourth DC-SQUID. The superconducting OA includes a first driver configured to receive a single flux quantum (SFQ) pulse train and amplify a first set of SFQ pulses associated with the SFQ pulse train to generate a first signal for driving the first DC-SQUID and the second DC-SQUID. The superconducting OA further includes a second driver configured to receive the SFQ pulse train and amplify a second set of SFQ pulses associated with the SFQ pulse train to generate a second signal for driving the third DC-SQUID and the fourth DC-SQUID.

20 Claims, 7 Drawing Sheets

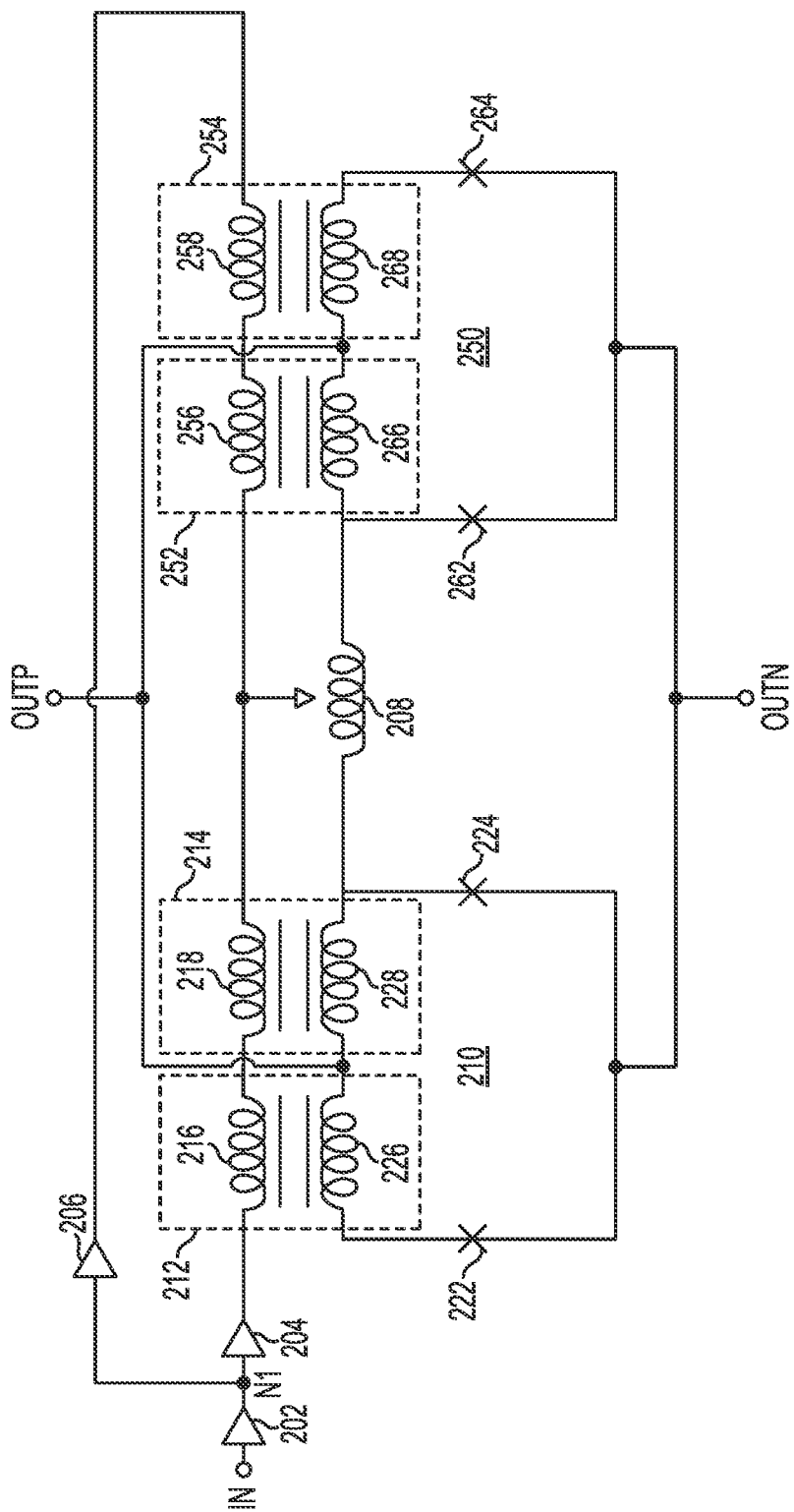

RECEIVING A PULSE TRAIN COMPRISING A PLURALITY OF SINGLE FLUX QUANTUM (SFQ) PULSES — 610

USING A SET OF DRIVERS, (1) AMPLIFYING A FIRST SET OF PULSES ASSOCIATED WITH THE PULSE TRAIN TO GENERATE A FIRST SET OF SIGNALS FOR DRIVING A FIRST SET OF DC-SQUIDS ASSOCIATED WITH THE PLURALITY OF COMPOUND DC-SQUIDS, AND (2) AMPLIFYING A SECOND SET OF PULSES ASSOCIATED WITH THE PULSE TRAIN TO GENERATE A SECOND SET OF SIGNALS FOR DRIVING A SECOND SET OF DC-SQUIDS ASSOCIATED WITH THE PLURALITY OF COMPOUND DC-SQUIDS, WHERE THE FIRST SET OF SIGNALS HAVE A SAME PHASE AS THE SECOND SET OF SIGNALS — 620

USING THE STACK OF THE PLURALITY OF COMPOUND DC-SQUIDS, CONVERTING THE FIRST SET OF SIGNALS AND THE SECOND SET OF SIGNALS INTO AN OUTPUT VOLTAGE WAVEFORM — 630

SUPERCONDUCTING OUTPUT AMPLIFIER INCLUDING COMPOUND DC-SQUIDS HAVING BOTH INPUTS DRIVEN BY AN INPUT SIGNAL HAVING THE SAME PHASE

BACKGROUND

Semiconductor based integrated circuits used in electronic devices include digital circuits based on complimentary metal-oxide semiconductor (CMOS) technology. CMOS technology, however, is reaching its limits in terms of the device size. In addition, leakage current in CMOS based digital circuits is causing high power consumption even when these circuits are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based systems is the use of superconducting logic-based systems. Such superconducting logic-based systems may also be used in combination with CMOS technology based components. Superconducting logic-based systems may include output amplifiers, which need to be improved for the various drawbacks such output amplifiers may have.

SUMMARY

In one example, the present disclosure relates to a superconducting output amplifier including a first compound direct current-superconducting quantum interference device (DC-SQUID) having a first DC-SQUID and a second DC-SQUID arranged in parallel to the first DC-SQUID. The superconducting output amplifier may further include a second compound DC-SQUID having a third DC-SQUID and a fourth DC-SQUID arranged in parallel to the third DC-SQUID. The superconducting output amplifier may further include an input terminal for receiving a single flux quantum (SFQ) pulse train. The superconducting output amplifier may further include a first driver configured to receive the SFQ pulse train from the input terminal and amplify a first set of SFQ pulses associated with the SFQ pulse train to generate a first signal for driving the first DC-SQUID and the second DC-SQUID. The superconducting output amplifier may further include a second driver configured to receive the SFQ pulse train from the input terminal and amplify a second set of SFQ pulses associated with the SFQ pulse train to generate a second signal for driving the third DC-SQUID and the fourth DC-SQUID.

In another aspect, the present disclosure relates to a method for a superconducting output amplifier comprising a stack of a plurality of compound direct current-superconducting quantum interference devices (DC-SQUIDs). The method may include receiving a pulse train comprising a plurality of single flux quantum (SFQ) pulses. The method may further include using a set of drivers, (1)) amplifying a first set of pulses associated with the pulse train to generate a first set of signals for driving a first set of DC-SQUIDs associated with the plurality of compound DC-SQUIDs, and (2) amplifying a second set of pulses associated with the pulse train to generate a second set of signals for driving a second set of DC-SQUIDs associated with the plurality of compound DC-SQUIDs, where the first set of signals have a same phase as the second set of signals. The method may further include using the stack of the plurality of compound DC-SQUIDs, converting the first set of signals and the second set of signals into an output voltage waveform.

In yet another aspect, the present disclosure relates to a superconducting output amplifier. The superconducting output amplifier may include a first compound direct current-superconducting quantum interference device (DC-SQUID) having a first DC-SQUID and a second DC-SQUID arranged in parallel to the first DC-SQUID. The superconducting output amplifier may further include a second compound DC-SQUID having a third DC-SQUID and a fourth DC-SQUID arranged in parallel to the third DC-SQUID. The superconducting output amplifier may further include an input terminal for receiving a single flux quantum (SFQ) pulse train, where the SFQ pulse train comprises data corresponding to reciprocal quantum logic encoding or data corresponding to phase-mode logic encoding. The superconducting output amplifier may further include a first driver configured to receive the SFQ pulse train from the input terminal and amplify a first set of pulses associated with the SFQ pulse train to generate a first signal for driving the first DC-SQUID and the second DC-SQUID. The superconducting output amplifier may further include a second driver configured to receive the SFQ pulse train from the input terminal and amplify a second set of pulses associated with the SFQ pulse train to generate a second signal for driving the third DC-SQUID and the fourth DC-SQUID.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 2 shows a circuit diagram of an example compound DC-SQUID in accordance with one example;

FIG. 6 shows a flow chart for a method related to a superconducting output amplifier in accordance with one example.

DETAILED DESCRIPTION

Figure 1:
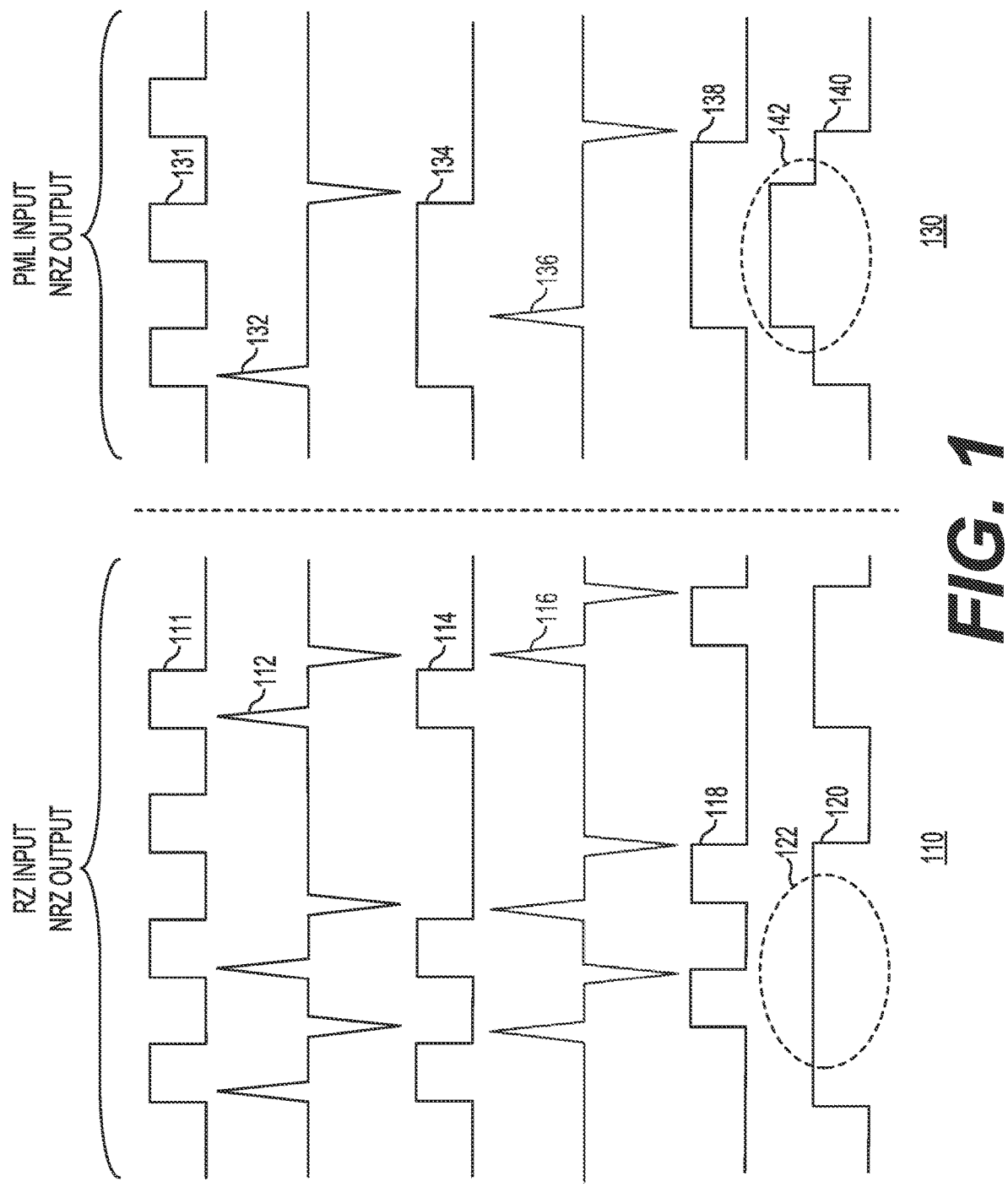
FIG. 1 shows graphs illustrating an uneven output voltage waveform generated by a compound direct current-superconducting quantum interference device (DC-SQUID)

Examples described in this disclosure relate to a superconducting output amplifier including compound direct current-superconducting quantum interference devices (DC-SQUIDs) having both inputs driven by an input signal having the same phase. Certain examples relate to a superconducting output amplifier having stacked compound DC-SQUIDs. A superconducting output amplifier with compound DC-SQUIDs may be implemented using any single flux quantum (SFQ) compatible logic. One example of such logic is quantum flux parametron (QFP). Another example of such logic is the reciprocal quantum logic (RQL). Certain examples further relate to reciprocal quantum logic (RQL) and phase-mode logic (PML) compatible superconducting output amplifiers. Unlike CMOS transistors, the RQL circuits are superconductor circuits that use Josephson junction-based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. As an example, at temperatures below Tc (e.g., 9.3 K), niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate, and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B, goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

For RQL, using RZ data encoding, a logical "1" may be encoded as a positive SFQ pulse followed by a negative SFQ pulse occurring half a period later, and a logical "0" may be encoded as no pulses. Alternately, for RQL operating in "phase-mode," the negative SFQ pulse may be delayed for an arbitrary number of clock cycles, but it may still be separated from the positive pulse by an odd number of half-clock cycles. In phase-mode logic (PML), digital values may be encoded as Josephson junction (JJ) phase. A high phase may indicate a logic "1" and a low phase may indicate a logic "0." Unlike reciprocal quantum logic (RQL) encoding, these values are persistent across clock cycles because there is no requirement for a reciprocal pulse to reset the JJ phase. As an example, if an AC clock, with four phases, were used to power the phase-mode logic circuit, the output of the phase-mode logic circuit may be persistent across all four phases of the AC clock.

In superconducting logic-based systems, the output amplifier converts a positive going single-flux quantum (SFQ) input pulse into DC voltage. The subsequent negative going SFQ disables this output voltage. Since there are no controllable resistors available in superconducting logic-based systems, the DC voltage is created by filtering the output oscillations of the direct current-superconducting quantum interference device (DC-SQUID). A DC-SQUID may consist of two Josephson junctions (JJs), connected in a loop via two inductors. An external DC current source may bias the DC-SQUID at a particular DC operating point such that oscillations will occur when the additional magnetic flux is coupled, via an inductive coupling, into the loop formed with the JJs. As one of the JJs fires, it causes the other JJ in the loop to fire, which starts a positive feedback sequence resulting in the DC-SQUID loop oscillating. Each oscillation of the DC-SQUID may release an SFQ voltage pulse which may then be averaged, via low-pass filters (LPFs) to create a smoothed DC voltage. The DC-SQUIDs may be stacked to create a larger total output voltage, which is output by the output amplifier.

FIG. 1 shows graphs 110 and 130 illustrating an uneven output voltage waveform generated by a compound direct current-superconducting quantum interference device (DC-SQUID). The data to be processed by the compound DC- SQUID is received in the form of a pulse train having both positive and negative SFQ pulses. Thus, the data input is inherently a return to zero (RZ) signal and is converted by the output amplifier into non-return to zero (NRZ) signal. This conversion is typically achieved by driving the two inputs of the compound DC-SQUID using different JTL vine trees that are driven with signals that are 180 degrees out of phase. As shown in graph 110 of FIG. 1, input pulse train 112 (an RZ signal) may be received via one of the DC-SQUIDs associated with the compound DC-SQUID and input pulse train 116 (an RZ signal) may be received by the other DC-SQUID. Reference clock 111 is shown to illustrate the relative timing of the various waveforms shown in FIG. 1. The actual clock signal, however, is a sinusoidal waveform not shown in FIG. 1. Pulse train 116 is 180 degrees out of phase relative to pulse train 112. Waveform 114 represents the JJ phase of data corresponding to pulse train 112 and waveform 118 represents the JJ phase of data corresponding to pulse train 116. In this example, the JJ phase represents an integral of the voltage associated with the SFQ pulses in respective pulse trains 112 and 116. Waveform 120 represents the non-return to zero (NRZ) output voltage waveform of the compound DC-SQUID. Dotted ellipse 122 identifies the center portion of waveform 120 where glitches can occur.

With continued reference to FIG. 1, graph 130 shows the waveforms associated with a compound DC-SQUID when the input data is phase-mode logic encoded data and the output is in the non-return to zero (NRZ) signal form. As shown in graph 130 of FIG. 1, input pulse train 132 (phase-mode logic (PML) input) may be received via one of the DC-SQUIDs associated with the compound DC-SQUID and input pulse train 136 (another PML input) may be received by the other DC-SQUID. Reference clock 131 is shown to illustrate the relative timing of the various waveforms shown in FIG. 1. The actual clock signal, however, is a sinusoidal waveform not shown in FIG. 1. Waveform 134 represents the JJ phase of data corresponding to pulse train 132 and waveform 138 represents the JJ phase of data corresponding to pulse train 136. In this example, the JJ phase represents an integral of the voltage associated with the SFQ pulses in respective pulse trains 132 and 136. Waveform 140 represents the phase-mode logic output voltage waveform of the compound DC-SQUID. The two DC-SQUIDs, in the compound DC-SQUID can load down each other when not driven. As shown via the dotted ellipse 142, this can cause the output voltage waveform for the phase-mode logic input to have two different output voltage levels. Other glitches in the output voltage can also occur because of the different phases of the two input signals.

FIG. 2 shows a circuit diagram of an example compound DC-SQUID 200 in accordance with one example. Compound DC-SQUID 200 is configured to address the variations in the output voltage level described earlier with respect to FIG. 1. Compound DC-SQUID 200 may include DC-SQUID 210 and DC-SQUID 250. In this example, compound DC-SQUID 200 may receive a return to zero (RZ) signals or phase-mode logic (PML) signals via an input terminal (IN). Although not shown in FIG. 2, a driver may be used to amplify a set of pulses associated with the single flux quantum (SFQ) pulse train into the RZ signals (e.g., DC-biased SFQ signals) or the PML signals. The RZ signals or the PML signals may be coupled via a Josephson transmission line (JTL) 202 to a node N1. Node N1 may further be coupled to DC-SQUID 210 via another JTL 204. Node N1 may also be coupled to DC-SQUID 250 via another JTL 206. This way, the same RZ signals or the same PML signals may be coupled to both inputs of the DC-SQUIDs. In one example, a resonator clock source may generate a sinusoidal or an alternating current (AC) clock that may provide both clock and power to the components associated with compound DC-SQUID 200. DC-SQUID 210 and DC-SQUID 250 may be coupled via an inductor 208. The input RZ signals or the PML signals may be coupled to DC-SQUID 210 via transformers 212 and 214. The input RZ signals or the PML signals may be coupled to DC-SQUID 250 via transformers 252 and 254. Compound DC-SQUID 200 may provide a positive output voltage at the OUTP terminal and a negative output voltage at the OUTN terminal in response to the RZ signals or the PML signals.

With continued reference to FIG. 2, DC-SQUID 210 may include two Josephson junctions (JJs) 222 and 224, which may be coupled in a loop via inductors 226 and 228. DC-SQUID 250 may include two JJs 262 and 266, which may be coupled in a loop via inductors 266 and 268. An external DC current source (not shown) may bias each of DC-SQUID 210 and DC-SQUID 250 at a particular operating point such that the DC-SQUIDs may oscillate when additional magnetic flux is applied to the respective loops. The inductive coupling between inductors 216 and 226 and the inductive coupling between inductors 218 and 228 may provide additional magnetic flux to DC-SQUID 210. Similarly, the inductive coupling between inductors 256 and 266 and the inductive coupling between inductors 258 and 268 may provide additional magnetic flux to DC-SQUID 250. The additional magnetic flux will result in the firing of the DC-SQUID that is receiving the additional magnetic flux. As one of the JJs (JJ 222 or JJ 224) fires, it causes the other JJ (JJ 222 or JJ 224) in the loop (e.g., the loop corresponding to DC-SQUID 210) to fire, which starts a positive feedback sequence resulting in the DC-SQUID loop oscillating. Similarly, as one of the JJs (JJ 262 or JJ 264) fires, it causes the other JJ (JJ 262 or JJ 264) in the loop (e.g., the loop corresponding to DC-SQUID 450) to fire, which starts a positive feedback sequence resulting in the DC-SQUID loop oscillating. Each oscillation of the DC-SQUID associated with the firing of the DC-SQUID may release a voltage pulse. Although FIG. 2 shows a certain number of components of compound DC-SQUID 200 arranged in a certain manner, there could be more or fewer number of components arranged differently.

In terms of the operation of compound DC-SQUID 200, in this example, transformers for both DC-SQUIDs 210 and 250 are driven by the same input currents generated by the RZ signals or the PML signals coupled via the input terminal (IN). As a result, advantageously both sides of compound DC-SQUID 200 are active at the same time when generating the output voltage. This, in turn, results in a smoother output voltage waveform.

Figure 3A:
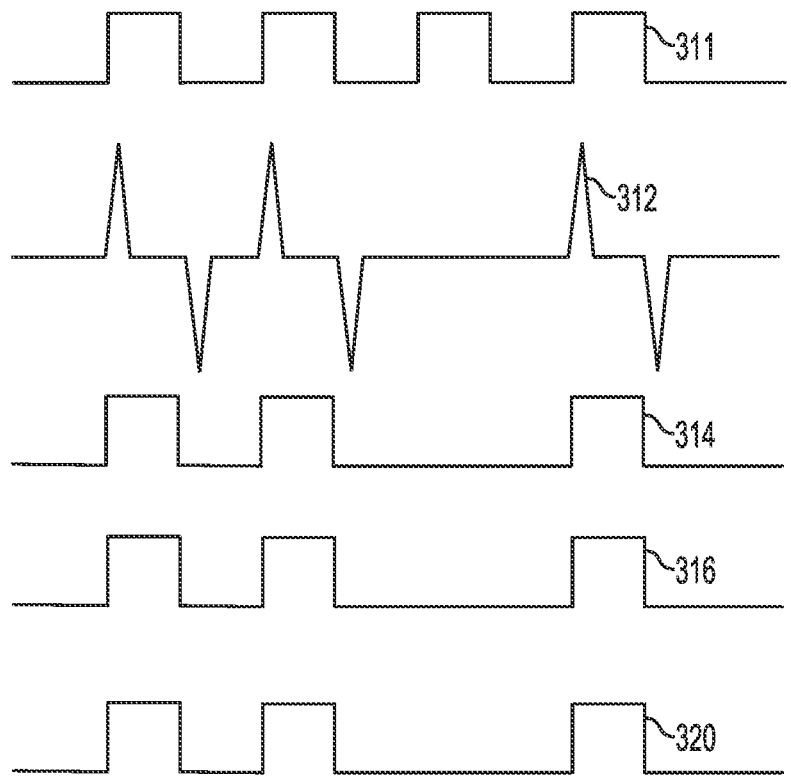
FIG. 3A is a graph showing the waveforms associated with the compound DC-SQUID of FIG. 2 in accordance with one example.

FIG. 3A is a graph 310 showing the waveforms associated with compound DC-SQUID 200 of FIG. 2 in accordance with one example. This example relates to an example in which the input signals are encoded based on reciprocal quantum logic encoding. Input pulse train 312 comprising both positive and negative SFQ pulses may be received via a driver. Reference clock 311 is shown to illustrate the relative timing of the various waveforms shown in FIG. 3A. The actual clock signal, however, is a sinusoidal waveform not shown in FIG. 3A. The driver may amplify a set of pulses associated with input pulse train 312 into two return to zero signals 314 and 316. In one example, the driver may amplify the SFQ pulses by DC-biasing the SFQ pulses. This process may include increasing the current amplitude of the SFQ pulses. In this example, RZ signals 314 and RZ signals 316 have the same phase (e.g., 0 degrees). The RZ signals 314 (e.g., DC-biased SFQ signals) may be received by one of the DC-SQUIDs (e.g., DC-SQUID 210 of FIG. 2) associated with compound DC-SQUID 200 and the other RZ signals 316 (e.g., DC-biased SFQ signals) may be received by the other DC-SQUID (e.g., DC-SQUID 250 of FIG. 2). Waveform 320 represents the output voltage waveform of compound DC-SQUID 200. As shown in FIG. 3A, the output voltage waveform is closer to an ideal output voltage waveform.

Figure 3B:
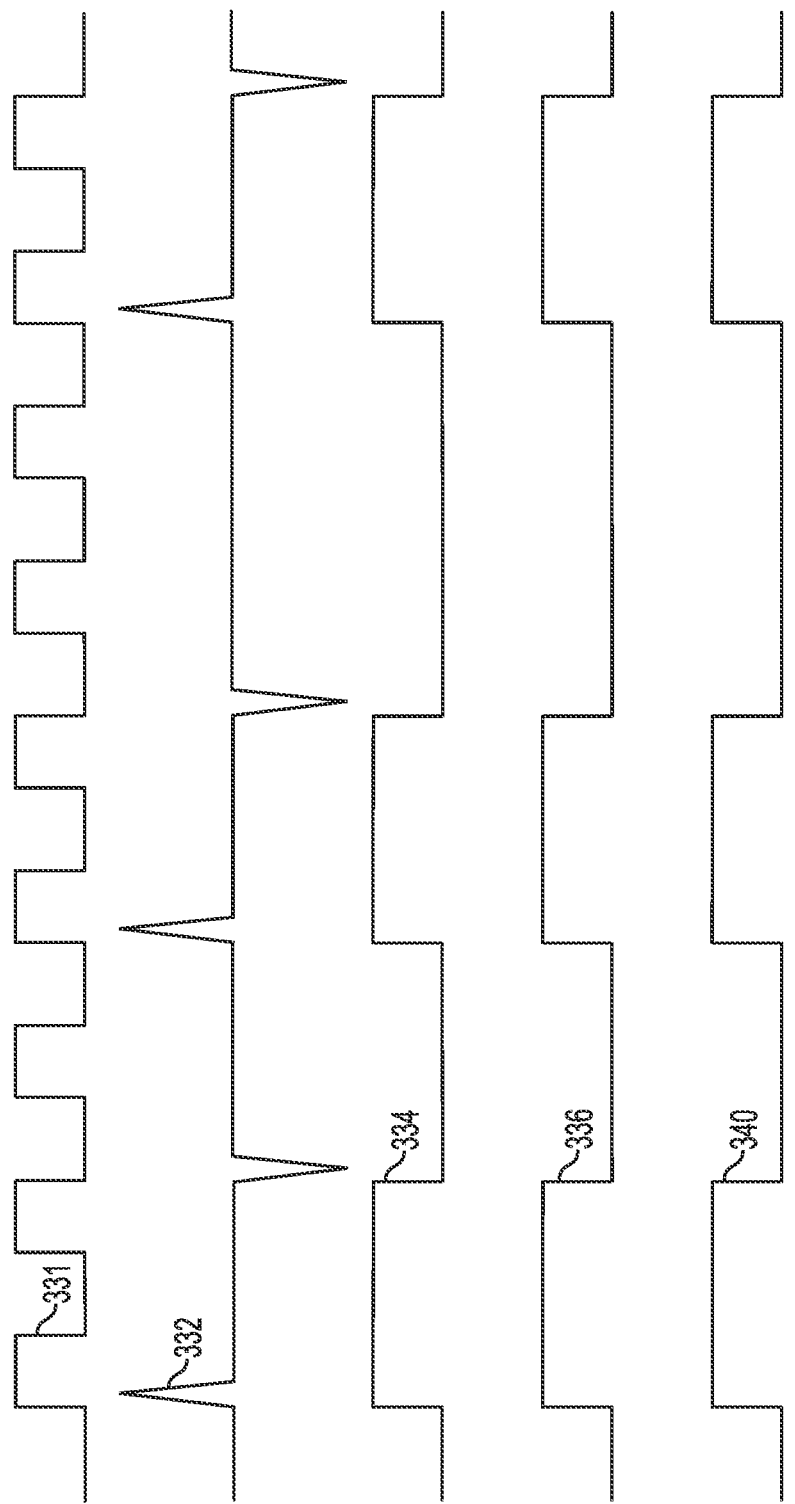
FIG. 3B is a graph showing the waveforms associated with compound DC-SQUID of FIG. 2 in accordance with another example.

FIG. 3B is a graph 330 showing the waveforms associated with compound DC-SQUID 200 of FIG. 2 in accordance with another example. This example relates to the input signals that have data encoded based on phase-mode logic encoding. Input pulse train 332 comprising both positive and negative SFQ pulses may be received via a driver. Reference clock 331 is shown to illustrate the relative timing of the various waveforms shown in FIG. 3B. The actual clock signal, however, is a sinusoidal waveform not shown in FIG. 3B. The driver may amplify a set of pulses associated with input pulse train 332 into two PML signals 334 and 336. In one example, the driver may amplify the SFQ pulses by DC-biasing the SFQ pulses. This process may include increasing the current amplitude of the SFQ pulses. In this example, PML signals 334 and PML signals 336 have the same phase (e.g., 0 degrees). The PML signals 334 (e.g., DC-biased SFQ signals) may be received by one of the DC-SQUIDs (e.g., DC-SQUID 210 of FIG. 2) associated with compound DC-SQUID 200 and the other PML signals 336 (e.g., DC-biased SFQ signals) may be received by the other DC-SQUID (e.g., DC-SQUID 250 of FIG. 2). Waveform 340 represents the phase-mode logic output voltage waveform of compound DC-SQUID 200. As shown in FIG. 3B, the output voltage waveform is closer to an ideal output voltage waveform.

Figure 4:
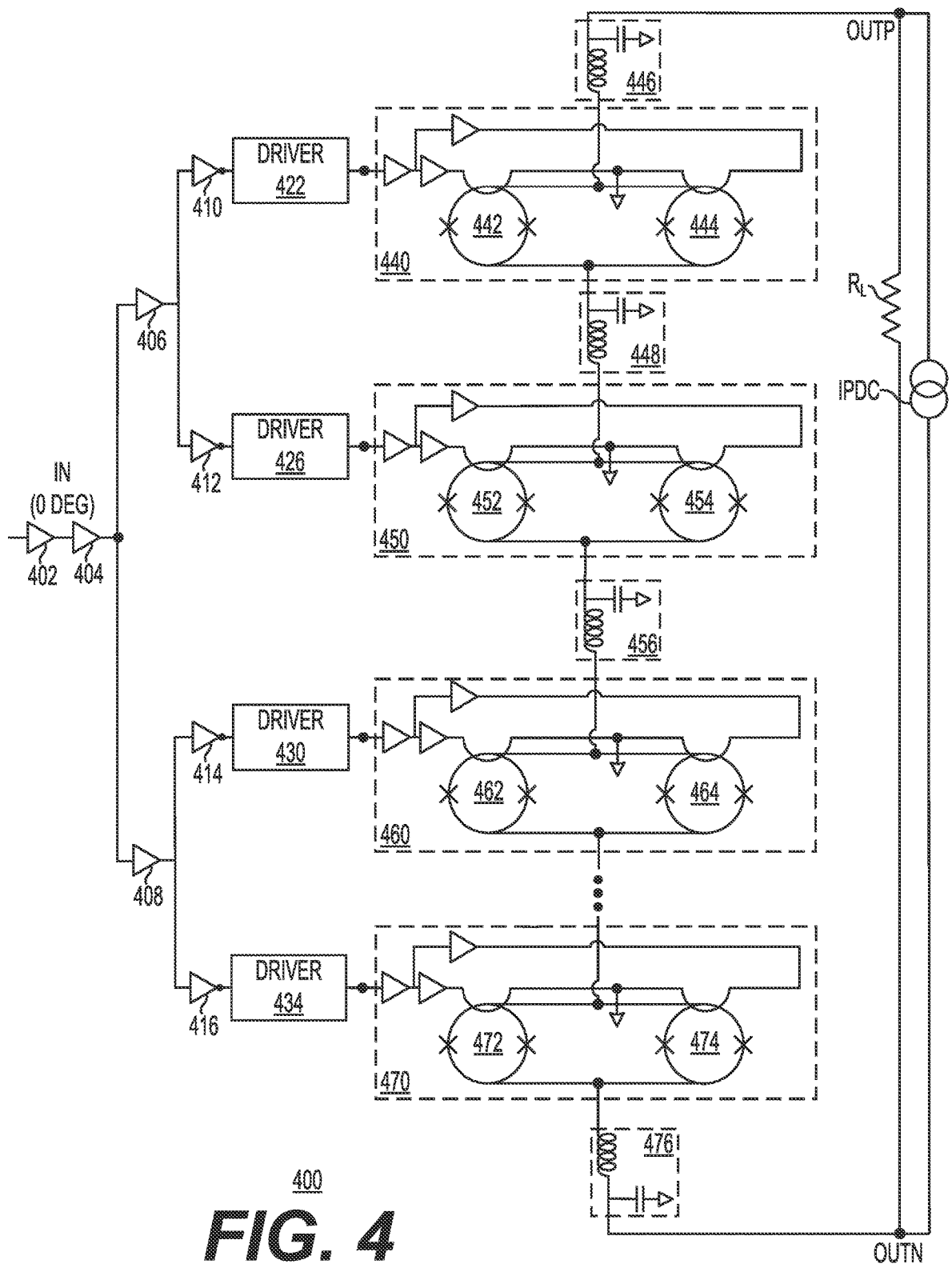
FIG. 4 shows a superconducting output amplifier including stacked compound DC-SQUIDs in accordance with one example.

FIG. 4 shows a superconducting output amplifier 400 including stacked compound DC-SQUIDs in accordance with one example. Superconducting output amplifier 400 may include a stack of compound DC-SQUIDs 440, 450, 460, and 470 connected in series. In this example, compound DC-SQUID 200 may be used to implement each of compound DC-SQUIDs 440, 450, 460, and 470. Superconducting output amplifier 400 may provide a positive output voltage via the positive output voltage terminal (OUTP) and a negative output voltage via the negative voltage terminal (OUTN). The load associated with superconducting output amplifier 400 is represented as a resistive load (RL). In addition, as shown in FIG. 4, a DC current source may be configured to provide a DC bias current (IPDC) to the compound DC-SQUIDs of superconducting output amplifier 400. An LC filter 446 may be coupled between compound DC-SQUID 440 and the positive output voltage terminal (OUTP). An LC filter 448 may be coupled between compound DC-SQUIDs 440 and 450. Another LC filter 456 may be coupled between compound DC-SQUIDs 450 and 460. An LC filter 476 may be coupled between compound DC-SQUID 470 and the negative output voltage terminal (OUTN). The LC filters may be configured to smooth the output voltages generated by the oscillating DC-SQUIDs.

With continued reference to FIG. 4, an input single flux quantum (SFQ) pulse train having a 0 degree phase may be coupled, via an input terminal (IN) to a driver associated with each of the compound DC-SQUIDs in the manner shown in FIG. 4. The SFQ pulse train may encode the digital data that needs to be amplified using the output amplifier. In one example, the digital data may be encoded based on using a pair of positive and negative (reciprocal) SFQ pulses. As an example, as part of reciprocal quantum logic encoding, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock. Alternately, for RQL operating in "phase-mode", the negative SFQ pulse may be delayed for an arbitrary number of clock cycles, but it may still be separated from the positive pulse by an odd number of half-clock cycles. In phase-mode logic (PML), digital values may be encoded as Josephson junction (JJ) phase. A high phase may indicate a logic "1" and a low phase may indicate a logic "0."

Still referring to FIG. 4, the SFQ pulse train may be coupled to the compound DC-SQUIDs via a vine tree distribution network, including a driver. The vine tree distribution network may include several Josephson transmission lines (JTLs) arranged in the form of a vine tree. Thus, in this example, the SFQ pulse train may be coupled to driver 422 via a Josephson transmission line (JTL) 402, a JTL 404, a JTL 406, and a JTL 410. Driver 422 may increase the current amplitude of the SFQ pulses associated with the SFQ pulse train. The current-amplified SFQ pulses corresponding to the RZ signals or the PML signals may be coupled to both sides of compound DC-SQUID 440. The SFQ pulse train may be coupled to driver 426 via JTL 402, a JTL 404, a JTL 406, and a JTL 412. Driver 426 may increase the current amplitude of the SFQ pulses associated with the SFQ pulse train. The current-amplified SFQ pulses corresponding to the RZ signals or the PML signals may be coupled to both sides of compound DC-SQUID 450. The SFQ pulse train may be coupled to driver 430 via JTL 402, a JTL 404, a JTL 408, and a JTL 414. Driver 430 may increase the current amplitude of the SFQ pulses associated with the SFQ pulse train. The current-amplified SFQ pulses corresponding to the RZ signals or the PML signals may be coupled to both sides of compound DC-SQUID 460. The SFQ pulse train may be coupled to driver 434 via a JTL 402, a JTL 404, a JTL 408, and a JTL 416. Driver 434 may increase the current amplitude of the SFQ pulses associated with the SFQ pulse train. The current-amplified SFQ pulses corresponding to the RZ signals or the PML signals may be coupled to both sides of compound DC-SQUID 470. Advantageously, the increase in the current amplitude of the SFQ pulses from the drivers may result in a reduction of the number of stacked compound DC-SQUIDs required for the superconducting output amplifier.

Each compound DC-SQUID may generate a voltage output based on the oscillations associated with the DC-SQUIDs. The IPDC current is set to a value that is sufficient to pre-bias the DC-SQUIDs but is not enough to trigger the Josephson junctions included as part of the DC-SQUIDs. Additional current is coupled to the DC-SQUIDs through the SFQ pulses received via the input terminal. The DC-SQUID fires when the current flowing through it exceeds the critical current of the JJs included as part of the DC-SQUID. The periodic firing of the DC-SQUIDs results in oscillations that are smoothed using the LC filters to generate the output voltage waveform. Advantageously, because both sides of compound DC-SQUIDs included in superconducting output amplifier 400 can be driven using the same input signal, there is no need for separate JTL vine trees. This, in turn, reduces the overall area of a superconducting output amplifier formed in an integrated circuit. In addition, the return to zero signal to non-return to zero conversion is not performed using the compound DC-SQUIDs. Although FIG. 4 shows a certain number of components of superconducting output amplifier 400 arranged in a certain manner, there may be additional or fewer components arranged differently. As an example, the input SFQ pulses may be distributed via a tree-like distribution network, a vine-like distribution network, or a hybrid distribution network including some combination of both the tree-like distribution network and the vine-like distribution network. Such networks may be formed using multiple JTLs.

Figure 5:
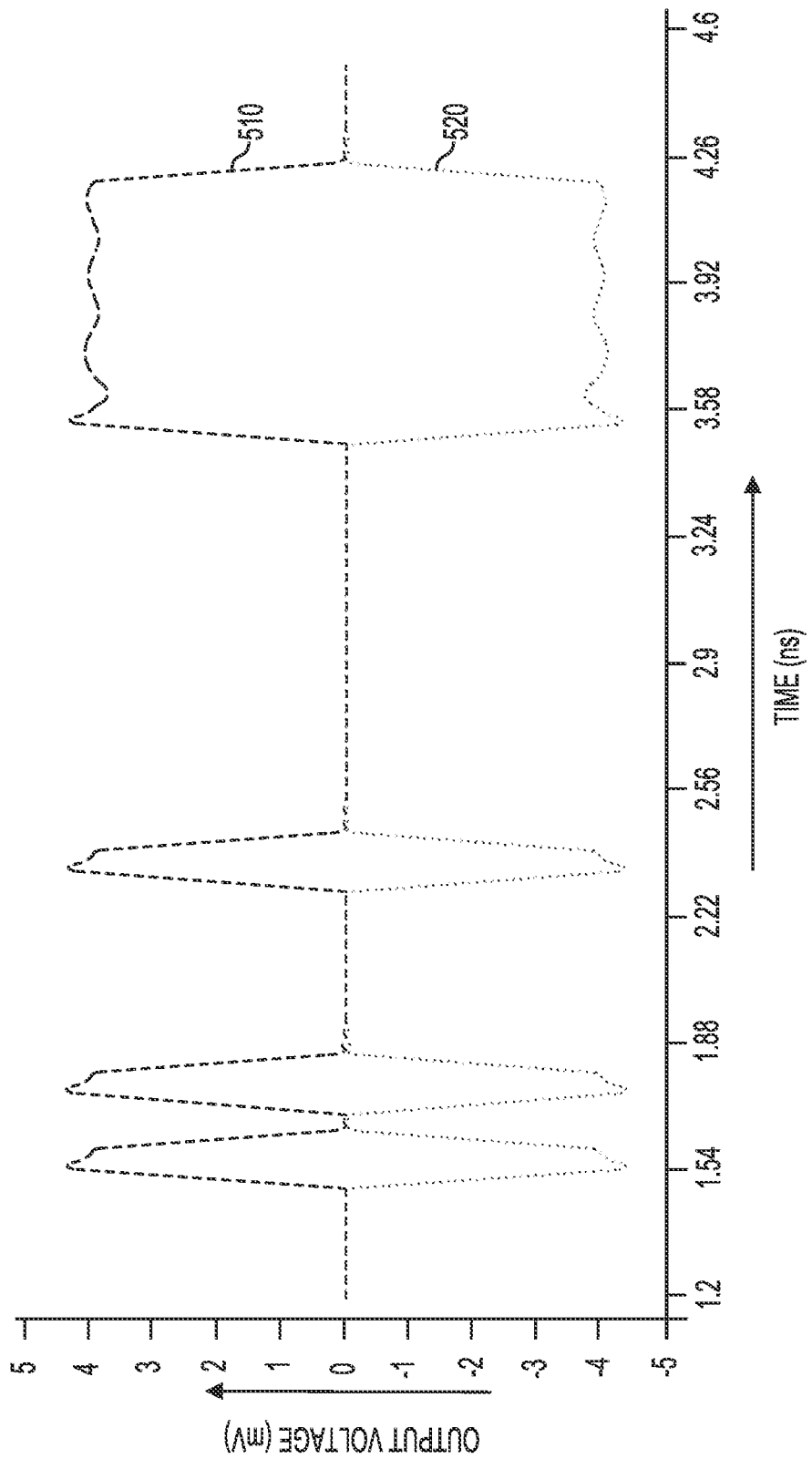
FIG. 5 shows an output waveform corresponding to the superconducting output amplifier of FIG. 4 in accordance with one example.

FIG. 5 shows an output waveform 500 corresponding to the superconducting output amplifier of FIG. 4 in accordance with one example. Output waveform 500 includes a positive output voltage waveform 510 and a negative output voltage waveform 520. Positive output voltage waveform 510 represents a simulated output at the positive output voltage terminal (OUTP) of superconducting output amplifier 400 of FIG. 4. Negative output voltage waveform 520 represents a simulated output at the negative output voltage terminal (OUTN) of superconducting output amplifier 400 of FIG. 4. Simulations of the output waveforms produced by superconducting output amplifier 400 shows that with a stack of 20 compound DC-SQUIDs, each of which may generate about 0.4 mV output, the superconducting output amplifier produces almost 8 mV output. Advantageously, the increased output voltage eases the post-processing amplification requirements and reduces the bit-error rate (BER) associated with the output of the superconducting output amplifier.

FIG. 6 shows a flow chart 600 for a method related to superconducting output amplifier 400 of FIG. 4 in accordance with one example. In this example, the method may be performed by the superconducting output amplifier described with respect to FIG. 4. Step 610 may include superconducting output amplifier 400 receiving a pulse train comprising a plurality of single flux quantum (SFQ) pulses. In this example, the pulse train including the SFQ pulses may be received via the input terminal (IN) and the data may be encoded using reciprocal quantum logic encoding or phase-mode logic encoding.

Step 620 may include using a set of drivers, (1) amplifying a first set of pulses associated with the pulse train to generate a first set of signals for driving a first set of DC-SQUIDs associated with the plurality of compound DC-SQUIDs, and (2) amplifying a second set of pulses associated with the pulse train to generate a second set of signals for driving a second set of DC-SQUIDs associated with the plurality of compound DC-SQUIDs, where the first set of signals have a same phase as the second set of signals. The set of drivers may include drivers 422, 426, 430, and 434 described earlier with respect to FIG. 4. As an example, amplifying the pulses associated with the pulse train may include the driver DC-biasing the SFQ pulses in the pulse train. This process may include increasing the current amplitude of the SFQ pulses. The compound DC-SQUIDs may include compound DC-SQUIDs 440, 450, 460, and 470 of FIG. 4. The first set of DC-SQUIDs may include DC-SQUIDs 442, 452, 462, and 472. The second set of DC-SQUIDs may include DC-SQUIDs 444, 454, 464, and 474.

Step 630 may include using the stack of the plurality of compound DC-SQUIDs, converting the first set of signals and the second set of signals into an output voltage waveform. As part of this step, the output voltages generated by each of the compound DC-SQUIDs may be filtered using the LC filters and may then be summed up to generate the output voltage waveform.

In conclusion, in one example, the present disclosure relates to a superconducting output amplifier including a first compound direct current-superconducting quantum interference device (DC-SQUID) having a first DC-SQUID and a second DC-SQUID arranged in parallel to the first DC-SQUID. The superconducting output amplifier may further include a second compound DC-SQUID having a third DC-SQUID and a fourth DC-SQUID arranged in parallel to the third DC-SQUID. The superconducting output amplifier may further include an input terminal for receiving a single flux quantum (SFQ) pulse train. The superconducting output amplifier may further include a first driver configured to receive the SFQ pulse train from the input terminal and amplify a first set of SFQ pulses associated with the SFQ pulse train to generate a first signal for driving the first DC-SQUID and the second DC-SQUID. The superconducting output amplifier may further include a second driver configured to receive the SFQ pulse train from the input terminal and amplify a second set of SFQ pulses associated with the SFQ pulse train to generate a second signal for driving the third DC-SQUID and the fourth DC-SQUID.

The superconducting output amplifier may further include an external direct current (DC) source configured to pre-bias each of the first DC-SQUID, the second DC-SQUID, the third DC-SQUID, and the fourth DC-SQUID. The second compound DC-SQUID may be stacked on top of the first compound DC-SQUID.

The SFQ pulse train may comprise data corresponding to reciprocal quantum logic encoding. The SFQ pulse train may comprise data corresponding to phase-mode logic encoding. The SFQ pulse train may comprise positive SFQ pulses and negative SFQ pulses.

Each of the first DC-SQUID, the second DC-SQUID, the third DC-SQUID, and the fourth DC-SQUID may be powered using alternating current (AC) clock signals. The first compound DC-SQUID and the second compound DC-SQUID may not be configured to convert return to zero signals into non-return to zero signals.

In another aspect, the present disclosure relates to a method for a superconducting output amplifier comprising a stack of a plurality of compound direct current-superconducting quantum interference devices (DC-SQUIDs). The method may include receiving a pulse train comprising a plurality of single flux quantum (SFQ) pulses. The method may further include using a set of drivers, (1)) amplifying a first set of pulses associated with the pulse train to generate a first set of signals for driving a first set of DC-SQUIDs associated with the plurality of compound DC-SQUIDs, and (2) amplifying a second set of pulses associated with the pulse train to generate a second set of signals for driving a second set of DC-SQUIDs associated with the plurality of compound DC-SQUIDs, where the first set of signals have a same phase as the second set of signals. The method may further include using the stack of the plurality of compound DC-SQUIDs, converting the first set of signals and the second set of signals into an output voltage waveform.

The pulse train may comprise data corresponding to reciprocal quantum logic encoding. The pulse train may comprise data corresponding to phase-mode logic encoding. The pulse train may comprise positive SFQ pulses and negative SFQ pulses.

The method may further include providing power to each of the first set of DC-SQUIDs and the second set of DC-SQUIDs using alternating current (AC) clock signals. Each of the first compound DC-SQUID and the second compound DC-SQUID may not be configured to convert return to zero signals into non-return to zero signals.

In yet another aspect, the present disclosure relates to a superconducting output amplifier. The superconducting output amplifier may include a first compound direct current-superconducting quantum interference device (DC-SQUID) having a first DC-SQUID and a second DC-SQUID arranged in parallel to the first DC-SQUID. The superconducting output amplifier may further include a second compound DC-SQUID having a third DC-SQUID and a fourth DC-SQUID arranged in parallel to the third DC-SQUID. The superconducting output amplifier may further include an input terminal for receiving a single flux quantum (SFQ) pulse train, where the SFQ pulse train comprises data corresponding to reciprocal quantum logic encoding or data corresponding to phase-mode logic encoding. The superconducting output amplifier may further include a first driver configured to receive the SFQ pulse train from the input terminal and amplify a first set of pulses associated with the SFQ pulse train to generate a first signal for driving the first DC-SQUID and the second DC-SQUID. The superconducting output amplifier may further include a second driver configured to receive the SFQ pulse train from the input terminal and amplify a second set of pulses associated with the SFQ pulse train to generate a second signal for driving the third DC-SQUID and the fourth DC-SQUID.

The superconducting output amplifier may further include an external direct current (DC) source configured to pre-bias each of the first DC-SQUID, the second DC-SQUID, the third DC-SQUID, and the fourth DC-SQUID. The second compound DC-SQUID may be stacked on top of the first compound DC-SQUID. The SFQ pulse train may comprise positive SFQ pulses and negative SFQ pulses.

Each of the first DC-SQUID, the second DC-SQUID, the third DC-SQUID, and the fourth DC-SQUID may be powered using alternating current (AC) clock signals. Each of the first compound DC-SQUID and the second compound DC-SQUID may not be configured to convert return to zero signals into non-return to zero signals.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with, transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting output amplifier comprising:
   a first compound direct current-superconducting quantum interference device (DC-SQUID) having a first DC-SQUID and a second DC-SQUID arranged in parallel to the first DC-SQUID;
   a second compound DC-SQUID having a third DC-SQUID and a fourth DC-SQUID arranged in parallel to the third DC-SQUID;
   an input terminal for receiving a single flux quantum (SFQ) pulse train;
   a first driver configured to receive the SFQ pulse train from the input terminal and amplify a first set of SFQ pulses associated with the SFQ pulse train to generate a first signal for driving the first DC-SQUID and the second DC-SQUID; and
   a second driver configured to receive the SFQ pulse train from the input terminal and amplify a second set of SFQ pulses associated with the SFQ pulse train to generate a second signal for driving the third DC-SQUID and the fourth DC-SQUID.

2. The superconducting output amplifier of claim 1, further comprising an external direct current (DC) source configured to pre-bias each of the first DC-SQUID, the second DC-SQUID, the third DC-SQUID, and the fourth DC-SQUID.

3. The superconducting output amplifier of claim 1, wherein the second compound DC-SQUID is stacked on top of the first compound DC-SQUID.

4. The superconducting output amplifier of claim 1, wherein the SFQ pulse train comprises data corresponding to reciprocal quantum logic encoding.

5. The superconducting output amplifier of claim 1, wherein the SFQ pulse train comprises data corresponding to phase-mode logic encoding.

6. The superconducting output amplifier of claim 1, wherein the SFQ pulse train comprises positive SFQ pulses and negative SFQ pulses.

7. The superconducting output amplifier of claim 1, wherein each of the first DC-SQUID, the second DC-SQUID, the third DC-SQUID, and the fourth DC-SQUID is powered using alternating current (AC) clock signals.

8. The superconducting output amplifier of claim 1, wherein each of the first compound DC-SQUID and the second compound DC-SQUID is not configured to convert return to zero signals into non-return to zero signals.

9. A method for a superconducting output amplifier comprising a stack of a plurality of compound direct current-superconducting quantum interference devices (DC-SQUIDs), the method comprising:
receiving a pulse train comprising a plurality of single flux quantum (SFQ) pulses;
using a set of drivers, (1) amplifying a first set of pulses associated with the pulse train to generate a first set of signals for driving a first set of DC-SQUIDs associated with the plurality of compound DC-SQUIDs, and (2) amplifying a second set of pulses associated with the pulse train to generate a second set of signals for driving a second set of DC-SQUIDs associated with the plurality of compound DC-SQUIDs, wherein the first set of signals have a same phase as the second set of signals; and
using the stack of the plurality of compound DC-SQUIDs, converting the first set of signals and the second set of signals into an output voltage waveform.

10. The method of claim 9, wherein the pulse train comprises data corresponding to reciprocal quantum logic encoding.

11. The method of claim 9, wherein the pulse train comprises data corresponding to phase-mode logic encoding.

12. The method of claim 9, wherein the pulse train comprises positive SFQ pulses and negative SFQ pulses.

13. The method of claim 9, further comprising providing power to each of the first set of DC-SQUIDs and the second set of DC-SQUIDs using alternating current (AC) clock signals.

14. The method of claim 9, wherein each of the first compound DC-SQUID and the second compound DC-SQUID is not configured to convert return to zero signals into non-return to zero signals.

15. A superconducting output amplifier comprising:
a first compound direct current-superconducting quantum interference device (DC-SQUID) having a first DC-SQUID and a second DC-SQUID arranged in parallel to the first DC-SQUID;
a second compound DC-SQUID having a third DC-SQUID and a fourth DC-SQUID arranged in parallel to the third DC-SQUID;
an input terminal for receiving a single flux quantum (SFQ) pulse train, wherein the SFQ pulse train comprises data corresponding to reciprocal quantum logic encoding or data corresponding to phase-mode logic encoding;
a first driver configured to receive the SFQ pulse train from the input terminal and amplify a first set of pulses associated with the SFQ pulse train to generate a first signal for driving the first DC-SQUID and the second DC-SQUID; and
a second driver configured to receive the SFQ pulse train from the input terminal and amplify a second set of pulses associated with the SFQ pulse train to generate a second signal for driving the third DC-SQUID and the fourth DC-SQUID.

16. The superconducting output amplifier of claim 15, further comprising an external direct current (DC) source configured to pre-bias each of the first DC-SQUID, the second DC-SQUID, the third DC-SQUID, and the fourth DC-SQUID.

17. The superconducting output amplifier of claim 15, wherein the second compound DC-SQUID is stacked on top of the first compound DC-SQUID.

18. The superconducting output amplifier of claim 15, wherein the SFQ pulse train comprises positive SFQ pulses and negative SFQ pulses.

19. The superconducting output amplifier of claim 15, wherein each of the first DC-SQUID, the second DC-SQUID, the third DC-SQUID, and the fourth DC-SQUID is powered using alternating current (AC) clock signals.

20. The superconducting output amplifier of claim 15, wherein each of the first compound DC-SQUID and the second compound DC-SQUID is not configured to convert return to zero signals into non-return to zero signals.

* * * * *